Figure 1:
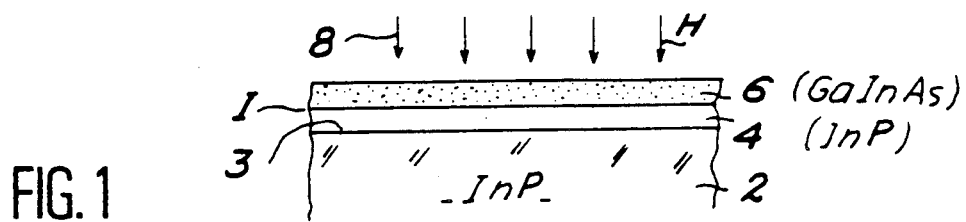

United States Patent [19]

Chevallier et al.

[11] Patent Number: 5,059,551

[45] Date of Patent: Oct. 22, 1991

[54] PROCESS FOR NEUTRALIZING ACCEPTOR ATOMS IN P-TYPE INP

[75] Inventors: Jacques Chevallier, Maurepas; Jean-Claude Pesant, Meudon la Forêt; Andrei Mircea, Yerres; Rose Benoîr, Paris, all of France

[73] Assignee: Etat Francais, represente par le Ministre Delegue des Postes, Telecommunications et de l'Espace (Centre National d'Etudes des Telecommunications), Issy les Moulineaux, France

[21] Appl. No.: 474,715

[22] PCT Filed: Aug. 17, 1989

[86] PCT No.: PCT/FR89/00423

§ 371 Date: Apr. 10, 1990

§ 102(e) Date: Apr. 10, 1990

[87] PCT Pub. No.: WO90/02416

PCT Pub. Date: Mar. 8, 1990

[30] Foreign Application Priority Data

Aug. 18, 1988 [FR] France ................ 88 10983

[51] Int. Cl.$^5$ ........................... H01L 21/324
[52] U.S. Cl. ........................ 437/96; 437/937
[58] Field of Search .................... 437/96, 937; 148/DIG. 18

[56] References Cited

U.S. PATENT DOCUMENTS 4,610,731 9/1986 Chevallier .............. 437/22
4,936,781 6/1990 Mircea et al. .......... 437/22

FOREIGN PATENT DOCUMENTS 0290230 1/1989 Japan.
85/02493 6/1985 World Int. Prop. O.

OTHER PUBLICATIONS

Le Vide, les Couches Minces, vol. 41, No. 231, Mar.-Apr. 1986, F. Proix. et al., "Interactions Comparees de L'Hydrogene Atomique et de L'Hydrogene Ionise Avec Gaas et InP Clives", pp. 189-190.
Extended Abstracts, vol. 85, No. 2, The Electrochemical Society, C. Santinelli et al., "Physico-Chemical and Elecrical Arsenic-Stabilization of InP Surface for M.I.S. Device Applications", p. 285.
Semiconductor Science & Technology, vol. 4, No. 2, Feb. 1989, IOP Publishing Ltd., J. Chevallier et al., "Hydrogen Passivation of Shallow Acceptors in p-Type InP", pp. 87-90.

Primary Examiner—Olik Chaudhuri
Assistant Examiner—Ourmazd S. Ojan
Attorney, Agent, or Firm—Oblon, Spivak, McClelland, Maier & Neustadt

[57] ABSTRACT

Process for neutralizing acceptor atoms in p-type InP. This process consists of subjecting to epitaxy a p-doped InP layer (4) and then a not intentionally doped $Ga_{0.47}In_{0.53}As$ layer (6) on an InP semiinsulating substrate (2), followed by hydrogenating the InP layer exposing the assembly to a hydrogen plasma (8) with a power density below 0.07 W/cm$^2$ at the most 250° C.

9 Claims, 1 Drawing Sheet

PROCESS FOR NEUTRALIZING ACCEPTOR ATOMS IN P-TYPE INP

The present invention relates to a process for neutralizing acceptor atoms in p-type InP using a hydrogen plasma or optionally deuterium or hydrogenated compounds.

It more particularly applies to the production of ultra-fast semiconductor components for use in microelectronics and at ultrahigh frequencies and more particularly for producing photodiodes on InP, or in optoelectronics for producing lasers emitting at 1.3 to 1.5 $\mu$m. In more general terms, the invention applies to all semiconductor devices where an electrical insulation is desired.

For some time now, interest has been attached to electrical neutralization by hydrogen of doping atoms (donors or acceptors) of semiconductor materials such as silicon, germanium, GaAs, GaAlAs, CdTe or ZnTe. In particular, the neutralization of donor atoms in GaAs by atomic hydrogen is described in the article in Appl. Phys. Lett. 47 (2), July 1985 by J. Chevallier et al "Donor Neutralization in GaAs(Si) by Atomic Hydrogen", pp.108-110 and in the article in J. Appl. Phys. 59(11) of June 1986 by A. Jalil et al "Electron Mobility Studies of the Donor Neutralization by Atomic Hydrogen in GaAs Doped with Silicon", pp.3774-3777.

However, hitherto nobody has been able to neutralize acceptor atoms in InP using a hydrogen plasma. Thus, the action of a hydrogen plasma on InP leads to a serious deterioration of the semiconductor surface due to the reaction of the phosphorus with the highly active hydrogenated species leading to the formation of phosphine and the appearance of indium droplets. It is also necessary to protect the surface of said semiconductor material when it is exposed to a hydrogen plasma.

The invention therefore relates to a process for neutralizing acceptor atoms in type p InP by a hydrogen plasma using a layer protecting the substrate surface. U.S. Pat. No. A-4 610 731 describes the deterioration of the InP surface subject to the action of a hydrogen plasma and therefore the need for providing a protective material thereon. It also teaches the deterioration of GaInAs under the same conditions.

However, the inventor has surprisingly found that, under certain conditions, a GaInAs layer could protect InP.

The invention therefore relates to a process for neutralizing acceptor atoms in a p-type InP material, essentially consisting of depositing a not intentionally doped $Ga_xIn_{1-x}As$ layer, in good crystal lattice agreement with InP, x being a number at the most equal to 1, followed by hydrogenating or deuterating the material by subjecting the assembly to a plasma of hydrogen, deuterium or a hydrogenated compound having a power density below 0.07 W/cm$^2$ for temperatures at the most equal to 250° C.

This GaInAs layer is permeable to atomic deuterium or hydrogen. In addition, no GaInAs surface deterioration can be observed under an optical microscope with a magnification of 1000, the surface remaining specular.

The non-deterioration of the GaInAs surface is due to the inventive use of a plasma having a power density below 0.07 W/cm$^2$. Thus, the inventors have found after a considerable amount of research that a power density above 0.07 W/cm$^2$ at the most 250° C. led to a GaInAs surface deterioration, which is the case in the aforementioned U.S. Pat. No. A-4 610 731, where the power density is 0.08 W/cm$^2$ and that this deterioration did not occur in the case of a power density below said value.

Preferably, the power density is 0.025 W/cm$^2$. Such a power density is adequate for hydrogenating InP through the GaInAs layer and without deteriorating the two semiconductor materials, whereas the same value automatically leads to an InP deterioration when the latter is not protected.

In order to avoid the accumulation of hydrogen or deuterium at the GaInAs/InP interface, it is necessary to use materials having a good lattice agreement. For this purpose, it is desirable for the $\Delta a/a$ ratio, a being the InP lattice parameter, to be as low as possible and e.g. equal to $5 \cdot 10^{-4}$, which corresponds to a composition x of the ternary layer of 0.47.

In order to assist the penetration of hydrogen or deuterium atoms into the InP, it is desirable to heat the sample during hydrogenation or deuteration to a temperature from 150° to 250° C.

The material to which the invention applies can be a solid InP substrate, or a single layer, or a multilayer structure of InP deposited on a substrate. In the latter case, the process according to the invention advantageously comprises the epitaxy of a p-doped InP layer on an InP substrate, the epitaxy of the $Ga_xIn_{1-x}As$ on the epitaxied InP layer and hydrogenation or deuteration of the InP layer.

The exposure of the GaInAs/p-InP structure permits the diffusion of hydrogen into InP over several micrometers and in high concentrations. The duration of the exposure to the hydrogen or deuterium plasma increases with the thickness of the GaInAs layer and possibly with that of the InP layer. The thickness of these layers is dependent on their subsequent use. In general, the GaInAs layer has a thickness between 0.3 and 1 $\mu$m and the InP layer a thickness between 0.3 and 3 $\mu$m.

As a function of the subsequent use of the hydrogenated or deuterated InP material, the GaInAs protective layer may be retained or eliminated. Its possible elimination is carried out by selective action using the dry or wet route (e.g. 5V of $H_2SO_4$/1V of $H_2O_2$/1V of $H_2O$ at 25° C). In the same way, the p doping level of the InP layer and the nature of the dopants is a function of its subsequent use. The dopants are elements of column II of the periodic classification of elements and in particular zinc and the dopant concentration varies from $10^{15}$ to $10^{19}$ atoms/cm$^3$.

Moreover, the hydrogenation (or deuteration) can take place on all or part of the p-InP layer.

Other features and advantages of the invention can be gathered from the following description of non-limitative embodiments with reference to the attached drawings, wherein show:

FIG. 1: Diagrammatically the different stages of the process according to the invention.

Figure 2:
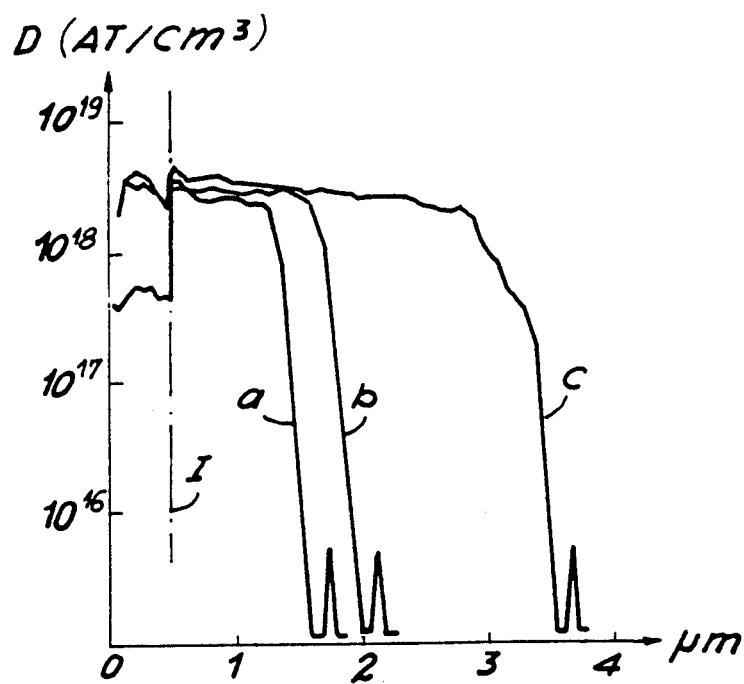

FIG. 2: The concentration profile of deuterium atoms D expressed in atoms/cm$^3$) introduced according to the invention into p-InP for different temperatures (in °C).

Figure 3:
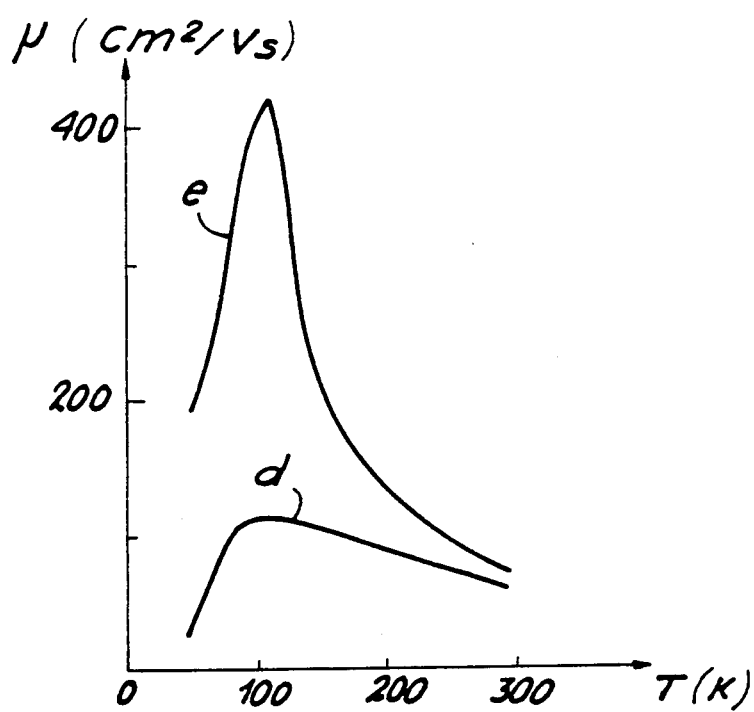

FIG. 3: The mobility $\mu$ of the holes (in cm$^2$/V·s) in p-InP treated according to the invention, followed by annealing as a function of the temperature (in °K).

On referring to FIG. 1, the first stage of the process consists of chemically cleaning the surface 3 of a semiinsulating InP substrate 2, followed by metalorganic thermal decomposition epitaxy, known as MOCVD, of a 4.9

μm InP layer 4 doped with zinc in a concentration of 2.5·10$^{18}$ atoms/cm$^3$, followed by the MOCVD epitaxy of a 0.55 μm thick, not intentionally doped Ga$_{0.47}$In$_{0.53}$As layer 6. A Δa/a ratio of 5·10$^{-4}$ corresponds to a ternary layer with a composition x of 0.47. The reference I designates the GaInAs-InP interface.

The assembly, i.e. the substrate +p-InP+GaInAs, is then subject to the action of a hydrogen plasma for 30 minutes at a power density of 0.025 W/cm$^2$, a frequency of 13.56 MHz, a pressure of approximately 1 mb (100 Pa) and a temperature of 250° C.

Under these conditions, observation with a magnification 1000 optical microscope revealed no deterioration of the surface of the GaInAs layer 6. Moreover, an effective passivation (or neutralization) effect of the zinc acceptors in the hydrogen diffusion region was obtained. This is due to the fact that hydrogen behaves like a deep compensating donor according to the Pantelides model. The resistivity of the InP material increases by 6 orders of magnitude or more for 6 hours exposure, which permits a hydrogen diffusion over the entire thickness of the epitaxied InP layer.

The hydrogen atoms used for the neutralization of the zinc atoms in the p-InP can be obtained from an ammonia or hydrogen plasma.

The process according to the invention permits the diffusion of hydrogen into InP over several micrometres and at high concentrations, as shown by FIG. 2. In order to study the hydrogen diffusion into InP according to the invention, an InP layer doped with 2.5·10$^{18}$ atoms/cm$^3$ of zinc was exposed to a deuterium plasma for 20 minutes. The frequency was 13.56 MHz, the pressure approximately 100 Pa, the power density 0.025 W/cm$^2$ and the temperature 250° C. The deuterium diffusion profile was analyzed by ion microprobe, known under the abbreviation SIMS.

These concentration profiles are given for different sample heating temperatures during deuterium diffusion. Curve a corresponds to a temperature of 163° C., curve b to 203° C. and curve c to 295° C. The straight line I parallel to the axis of X corresponds to the GaInAs -InP interface.

These curves clearly indicate the deuterium diffusion through the undoped GaInAs layer, as well as the absence of deuterium accumulation at the GaInAs/InP interface. This is due to a good compatibility of the lattice parameters between the two semiconductors.

In a structure having a good lattice agreement, so that Δa/a is 13·10$^{-3}$, there is a deuterium concentration at the interface I 3 to 5 times higher than the deuterium concentration in the epitaxied InP layer. However, the deuterium penetration depth and the hydrogen solubility in the InP layer are identical for structures having a good lattice agreement and structures having an inferior lattice agreement of 13·10$^{-3}$.

FIG. 2 shows that the deuterium concentration profile has a plateau, followed by an abrupt drop. Moreover, it can be seen that the penetration depth of the deuterium atoms increases with the temperature. It can finally be seen that the deuterium concentration on the plateau region is substantially independent of the temperature for temperatures below 300° C. and is equal to the concentration of the free holes.

In the same way, the inventors have found that the deuterium concentration was independent of the plasma exposure time. These results clearly indicate that in this diffusion process the hydrogen or deuterium concentration profile corresponds to that of the zinc concentration. This is a first indication of the relationship between the hydrogen atoms and the zinc atoms in a p-type InP material at diffusion temperatures at the most equal to 300° C.

The formation of Zn-H complexes in p-type InP was revealed by infrared absorption spectroscopy.

The inventors also found that these complexes were relatively stable at measurement temperatures below 300° K. To this end, several samples like those shown in FIG. 1 and with a p doping level of 2.5·10$^{18}$ atoms/cm$^3$ in InP, were exposed to a hydrogen plasma for 6 hours at 200° C and were then annealed at 275° C. for 5 minutes, the concentration of the holes at 300° K being 1.3·10$^{16}$ holes/cm$^3$, which signifies that 99% of the zinc atoms were still passivated after annealing.

The neutralization by hydrogen of the acceptor ions in InP permits an increase of the mobility of the carrier, in this case the holes, as can be clearly gathered from FIG. 3. Curve d gives the mobility of the carriers as a function of the temperature for a zinc-doped InP layer alone and curve e the same variations following hydrogenation according to the invention and a partial annealing at 275° C. of the hydrogenated InP layer for a time of 5 minutes. This increase in the mobility of the holes in hydrogenated InP, for temperatures below 300° K, is due to a reduction in the concentration of the ionized impurities. Thus, the neutralization by hydrogen of the acceptor atoms leads to the formation of neutral complexes.

The mobility of the holes at 120° K is 10 times higher for hydrogenated p-InP, whilst the mobility of the electrons in hydrogenated n-GaAs(Si) is increased by more than a factor of 2 (cf. the aforementioned article by Jalil).

The process according to the invention consequently makes it possible to produce p-type slightly doped or semiinsulating InP layers (accompanied by an appropriate annealing) with a high mobility of the holes. This demonstrates the good electronic properties of the thus treated materials.

In addition, the inventive process can be advantageously used for producing electric insulation zones in electronic or optoelectronic devices. For example, the inventive process can advantageously replace an implantation of protons in InP/GaInAs laser technology in order to define an active zone and can then avoid the presence of highly damaged regions in the vicinity of the active zone of the laser.

We claim:

1. Process for the neutralization of acceptor atoms in a p-type InP material (4), essentially consisting of depositing a not intentionally doped Ga$_x$In$_{1-x}$As layer (6), in good crystal lattice agreement with the InP, x being a number at the most equal to 1, then hydrogenating or deuterating said material by subjecting the assembly (4, 6) to a plasma (8) of hydrogen, deuterium or a hydrogenated compound having a power density below 0.07 W/cm$^2$ and at the most at 250° C.

2. Neutralization process according to claim 1, characterized in that the lattice agreement is such that $0 \leq \Delta a/a \leq 13\cdot 10^{-3}$, with a being the InP lattice parameter and Δa the variation between the InP lattice parameter and that of Ga$_x$In$_{1-x}$As.

3. Neutralization process according to claim 2, characterized in that the Δa/a ratio is 5·10$^{-4}$.

4. Neutralization process according to one of the claims 1 to 3, characterized in that the power density is approximately 0.025 W/cm$^2$ at a maximum of 250° C.

5. Neutralization process according claim 1 characterized in that it comprises the stages of epitaxially growing a p-doped InP layer (4) on to an InP substrate (2), epitaxially growing the $Ga_xIn_{1-x}As$ layer (6) on to the epitaxially grown InP layer and hydrogenation or deuteration of the InP layer.

6. Neutralization process according to claim 1 characterized in that the acceptor atoms are zinc atoms.

7. Neutralization process according to claim 1 characterized in that the concentration of acceptor atoms is between $10^{15}$ and $10^{19}$ atoms/cm$^3$.

8. Neutralization process according to claim 1 characterized in that the $Ga_xIn_{1-x}As$ layer has a thickness of 0.1 to 1 $\mu$m.

9. Neutralization process according to claim 1 characterized in that hydrogenation or deuteration is performed at a temperature of 150° to 250° C.

* * * * *